(12) United States Patent
Lin

(10) Patent No.: US 9,342,191 B2
(45) Date of Patent: May 17, 2016

(54) ELECTROSTATIC AND PIEZOELECTRIC TOUCH PANEL

(71) Applicant: CHUNG HUA UNIVERSITY, Hsinchu (TW)

(72) Inventor: Jium Ming Lin, Hsinchu (TW)

(73) Assignee: CHUNG HUA UNIVERSITY, Hsinchu (TW)

( * ) Notice: Subject to any disclaimer, the term of this patent is extended or adjusted under 35 U.S.C. 154(b) by 167 days.

(21) Appl. No.: 14/446,853

(22) Filed: Jul. 30, 2014

(65) Prior Publication Data

US 2016/0011722 A1    Jan. 14, 2016

(30) Foreign Application Priority Data

Jul. 8, 2014    (TW) .............................. 103123417 A

(51) Int. Cl.
*H01L 27/20* (2006.01)
*G06F 3/044* (2006.01)
(Continued)

(52) U.S. Cl.
CPC .............. *G06F 3/0433* (2013.01); *G06F 3/044* (2013.01); *G06F 3/0416* (2013.01); *H01L 27/20* (2013.01); *G06F 2203/04106* (2013.01)

(58) Field of Classification Search
USPC .................................................. 345/173–174
See application file for complete search history.

(56) References Cited

U.S. PATENT DOCUMENTS 8,847,916 B2 * 9/2014 Kurokawa ........... G02F 1/13338
345/156
2011/0000060 A1 * 1/2011 Lee ......................... H01L 27/20
29/25.35

(Continued)

FOREIGN PATENT DOCUMENTS

CN    101046716    10/2007
CN    102929422    2/2013
(Continued)

OTHER PUBLICATIONS

Office Action of the corresponding Taiwanese application 103123417 dated Jan. 20, 2016 from Taiwan Intellectual Property Office.

(Continued)

*Primary Examiner* — Kumar Patel
*Assistant Examiner* — Amy C Onyekaba
(74) *Attorney, Agent, or Firm* — WPAT, P.C., Intellectual Property Attorneys; Anthony King

(57) ABSTRACT

An electrostatic and piezoelectric touch panel includes a first switching circuit, a second switching circuit, at least one first sensing device, and at least one second sensing device. The first sensing device includes a first transistor and a piezoelectric-transistor. The first transistor and the piezoelectric-transistor are series-connected between a power source and ground. The first switching circuit connects to a connection point between the first transistor and the piezoelectric-transistor. The second sensing device includes a second transistor and two parallel-connected electrostatic to transistors. The second transistor and the two parallel-connected electrostatic transistors are series-connected between a negative power source and ground. The first switching circuit connects to a connection point between the second transistor and the two parallel-connected electrostatic transistors. Gates of the first and second transistors connect to the second switching circuit. The two parallel-connected electrostatic transistors include different types of doped semiconductor materials.

14 Claims, 14 Drawing Sheets

(51) Int. Cl.
*G06F 3/043* (2006.01)
*G06F 3/041* (2006.01)

(56) References Cited

U.S. PATENT DOCUMENTS

| | | | | |
|---|---|---|---|---|
| 2012/0256838 | A1* | 10/2012 | Lee | H03K 17/9643 345/168 |
| 2013/0176265 | A1* | 7/2013 | Zurek | G06F 1/3262 345/174 |
| 2014/0198072 | A1* | 7/2014 | Schuele | G06F 3/044 345/174 |

FOREIGN PATENT DOCUMENTS

| | | | |
|---|---|---|---|
| CN | 103197821 | | 7/2013 |
| CN | 103197821 A | * | 7/2013 |
| JP | 2009229248 A | * | 10/2009 |
| JP | 2013105581 A | * | 5/2013 |
| TW | 201248476 | | 12/2012 |

OTHER PUBLICATIONS

English abstract translation of the Office Action of the corresponding Taiwanese application 103123417 dated Jan. 20, 2016 from Taiwan Intellectual Property Office.
English abstract translation of CN 101046716.
English abstract translation of TW 201248476.
English abstract translation of CN 103197821.
English abstract translation of CN 102929422.

* cited by examiner

ELECTROSTATIC AND PIEZOELECTRIC TOUCH PANEL

BACKGROUND

1. Technical Field

The present invention relates to an electrostatic and piezoelectric touch panel.

2. Related Art

Keyboards and optical mice are the most common and widely used information input apparatuses designed for computers. However, due to the size and inconvenience of carrying such apparatuses, touch input devices, which can be stacked on screens, are developed as a replacement.

Touch panels are user-friendly input devices, which allow direct input of a command by using a finger or stylus to touch a specific region on the panels. The trending demand of most electronic products is the need to be light, thin, short, small, and capable. Although such requirements cause available space in electronic products to become more and more constrained, touch devices can be implemented so as to advantageously use less space. A touch device not only functions as a keyboard and an optical mouse, but also provides a handwriting data input function. Therefore, touch devices offer the best solution for a human-machine interface.

According to their operation principles, touch panels can be classified into four categories: resistive touchscreen panels, capacitive touchscreen panels, optical touchscreens, and surface wave touchscreen panels. Each category has one or more disadvantages. The resistive touchscreen panels have lower light transmittance and suffer from poorer contrast and low brightness. The capacitive touchscreen panels are easily affected by temperature, humidity, and grounding level, and have poor stability as a result. Moreover, the capacitive touchscreen panels need a conductor in order to operate; otherwise, the capacitive touchscreen panels cannot detect a contact. The resolutions of the optical touchscreens are determined by the number of infrared emitters or receivers and their resolutions are limited. The surface wave touchscreen panels use transmitting transducers to generate surface waves and receiving transducers to receive the surface waves. The position of a touch point is determined by using a diagram describing a relationship between received signal strength and time. U.S. Pat. No. 4,644,100 discloses a surface wave touchscreen using one transmitting transducer and one receiving transducer. However, because the speed of a surface wave is faster, a surface wave touchscreen needs a faster signal processor and a high performance analogue/digital converter such that the cost of a surface wave touchscreen is high. By attempting to reduce the cost, the resolution of the surface wave touchscreen has to be compromised.

The current touch panels have many problems. For example, each touch panel employs only one touchscreen technology. A capacitive touchscreen panel may detect contact when a finger does not touch the panel because of a cross-linking effect, leading to a touch false judgment.

SUMMARY

In one embodiment, an electrostatic and piezoelectric touch panel comprises a first switching circuit, a second switching circuit, at least one first sensing device, and at least one second sensing device. The at least one first sensing device comprises a first transistor and a piezoelectric-transistor connected with the first transistor in series between a power source and ground, wherein the first switching circuit connects to a connection linking the first transistor and the piezoelectric-transistor. The at least one second sensing device comprises a second transistor and two parallel-connected electrostatic transistors connected with the second transistor in series between the power source and the ground, wherein the first switching circuit connects to a connection linking the second transistor and the two parallel-connected electrostatic transistors. The gates of first and second transistors connect to the second switching circuit. The two parallel-connected electrostatic transistors comprise different types of doped semiconductor materials.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF DISCLOSED EMBODIMENTS

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

Figure 1:
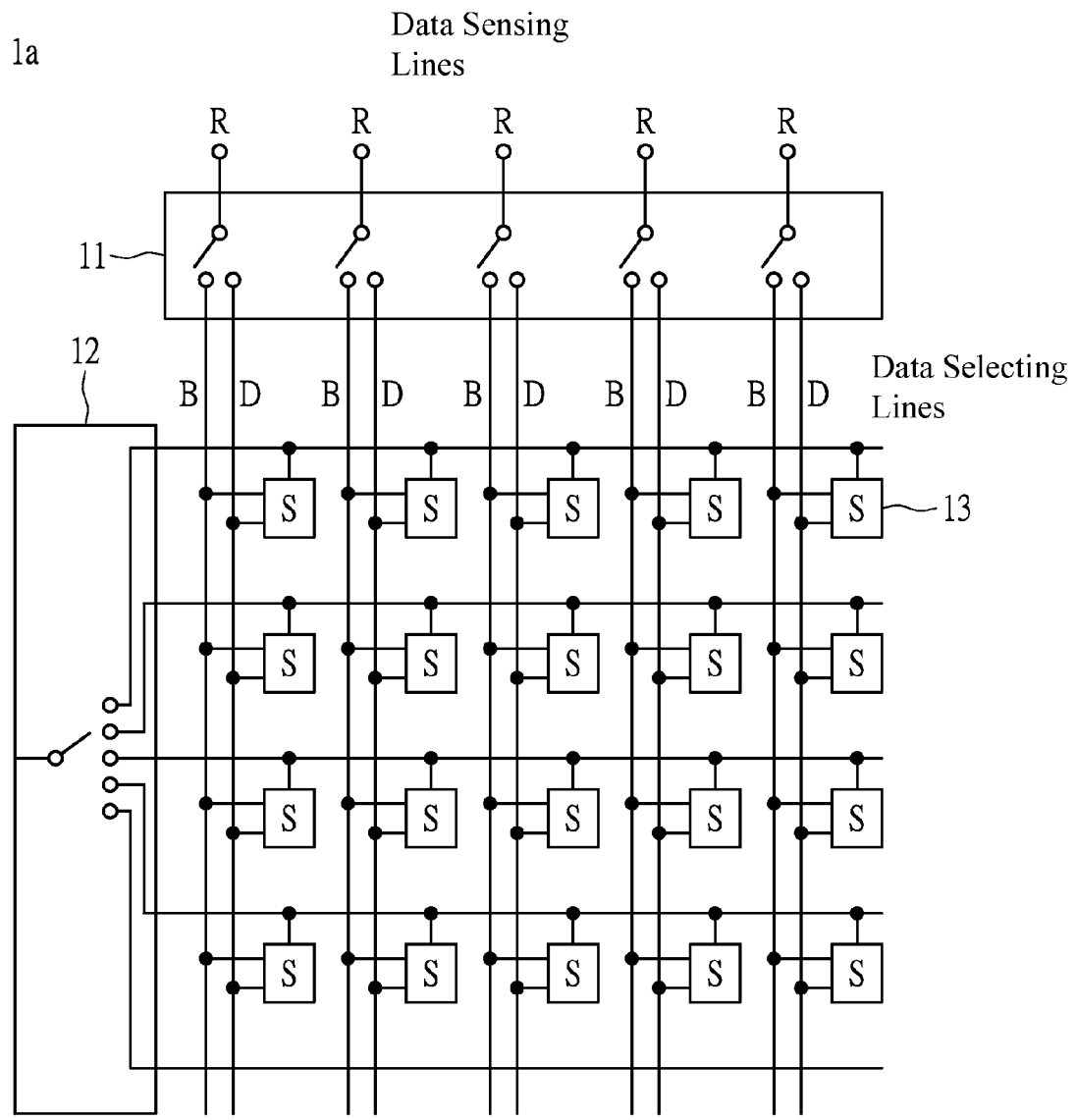
FIG. 1 is a view showing a touch panel that uses a positive power source according to one embodiment of the present invention.

Referring to FIG. 1, an electrostatic and piezoelectric touch panel 1a comprises a power source having a positive terminal and a negative terminal, a first switching circuit 11, a second switching circuit 12, and a plurality of sensing circuits 13. The sensing circuits 13 can be arranged in an array, and respectively coupled with the first switching circuit 11 and the second switching circuit 12. The first switching circuit 11 and the second switching circuit 12 are configured to individually select a sensing circuit 13. The first switching circuit 11 includes integrated R terminals of data sensing lines. When the data sensing lines are sequentially selected with the sequential selection of the data selecting lines connecting to corresponding terminals B and D, the position for a single or multiple contact positions of an object, such as a finger(s), on the touch panel 1a can be determined.

Figure 2:
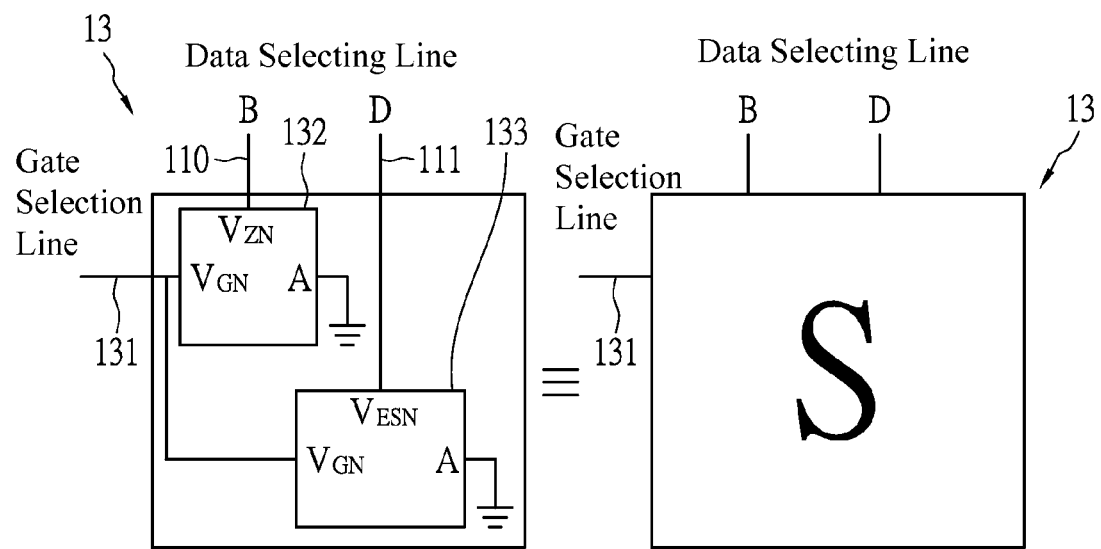
FIG. 2 is a view showing a sensing circuit using a positive power source according to one embodiment of the present invention.

Referring to FIG. 2, each sensing circuit 13 uses terminals B and D to respectively connect to data selecting lines 110 and 111 and further to the first switching circuit 11. Each sensing circuit 13 uses a gate selection line (or data sensing line) 131 in order to connect to the second switching circuit 12. Each sensing circuit 13 includes a first sensing device 132 and a second sensing device 133. The first sensing device 132 connects to the data selecting line 110, and the second sensing device 133 connects to the data selecting line 111. Moreover, in some embodiments, the first and second sensing devices 132 and 133 use the same gate selection line 131 in order to connect to the second switching circuit 12; however, the present invention is not limited to such a type of connection. In addition, the first and second sensing devices 132 and 133 can connect to ground.

Figure 3A:
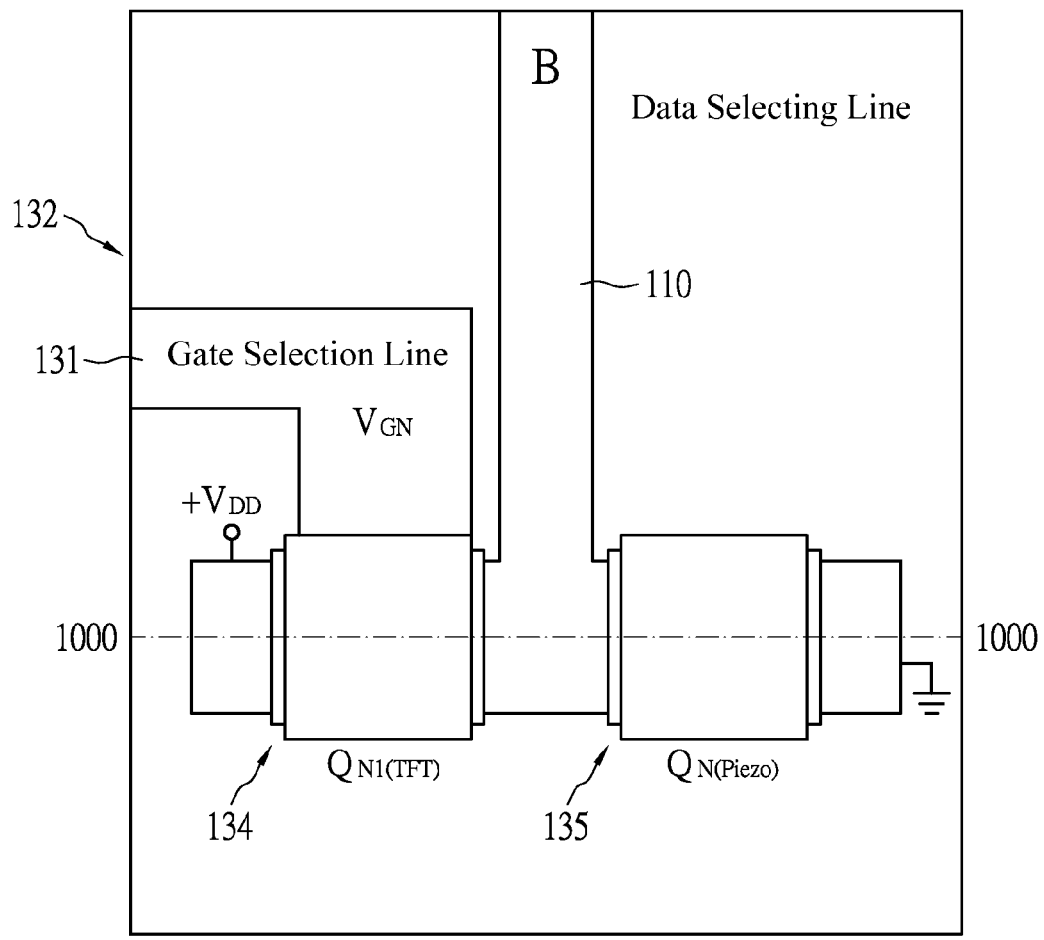
FIG. 3A is view showing a first sensing device using a positive power source according to one embodiment of the present invention.
Figure 3B:
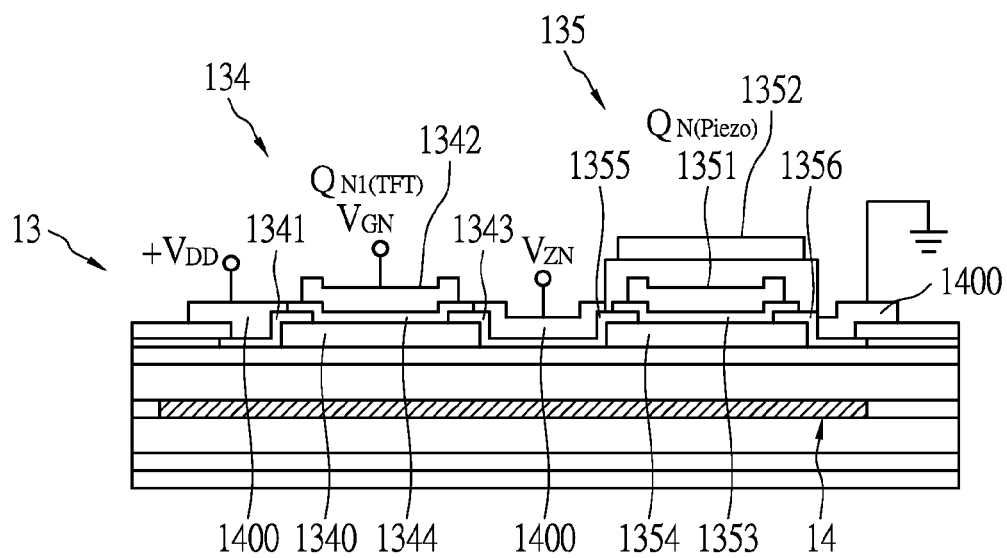
FIG. 3B is a cross-sectional view along line 1000-1000 of FIG. 3A.
Figure 3C:
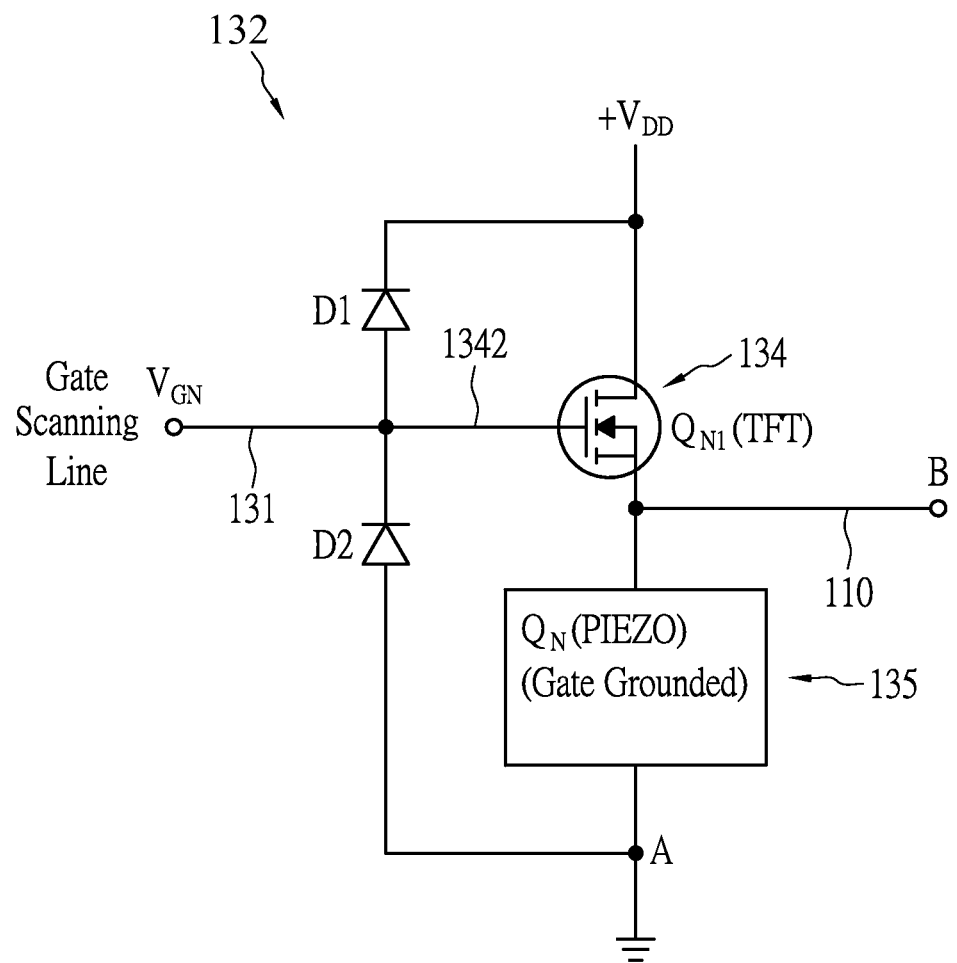
FIG. 3C is a view showing a first sensing device using a positive power source and diodes for prevention of electrostatic discharge damage according to one embodiment of the present invention.

Referring to FIGS. 3A to 3C, the first sensing device 132 comprises a first transistor 134 and a first piezoelectric-transistor 135. The first transistor 134 and the first piezoelectric-transistor 135 are connected in series between a positive power source and ground. Furthermore, the first switching circuit 11 can use a data selecting line 110 in order to connect to a connection linking the first transistor 134 and the first piezoelectric-transistor 135. In addition, the gate of the first transistor 134 can connect to the second switching circuit 12.

In some embodiments, the first transistor 134 comprises an n-type metal oxide semiconductor field effect transistor. The first transistor 134 and the first piezoelectric-transistor 135 are connected in series between a positive power source (+$V_{DD}$) and ground. The first transistor 134 and the first piezoelectric-transistor 135 can be above a light-blocking layer 14. The light-blocking layer 14 can be electrically conductive. The first piezoelectric-transistor 135 comprises a piezoelectric material 1351. Moreover, negative voltage can be applied between the gate 1352 of the first piezoelectric-transistor 135 and the corresponding light-blocking layer 14 in order to make the polarization direction of the first piezoelectric-transistor 135 upward. Specifically, positive charges accumulate over the top surface of dielectric layer 1353. A small quantity of negative charges in response accumulate on an upper surface of the channel 1354 of the first piezoelectric-transistor 135, which causes the first piezoelectric-transistor 135 to be in a state of the threshold of current conduction that allows a current of, for example, less than 1 microampere to flow (this invention is not limited to this value). Referring to FIG. 3C, during operation of the touch panel 1a, the gate 1352 of the first piezoelectric-transistor 135 is grounded, and thus, when the first piezoelectric-transistor 135 is touched, the strength of upward polarization will increase so that more negative charges accumulate on the upper surface of the channel 1354 of the first piezoelectric-transistor 135. As a result, the first piezoelectric-transistor 135 is open or does not electrically connect to other circuits and the channel 1354 allows a larger current of, for example, 10 microamperes (this invention is not limited to this value), to flow.

In some embodiments, the gate 1352 of the first piezoelectric-transistor 135 is transparent.

Referring to FIGS. 3B and 3C, in some embodiments, during a scanning operation, a voltage, $V_{GN}$, applied to the gate selection lines 131 is substantially equal to the voltage of the positive power source (+$V_{DD}$).

Referring to FIG. 3B, the first transistor 134 comprises a semiconductor material 1340 and three terminals (1341, 1342, and 1343). The first piezoelectric-transistor 135 comprises two terminals 1355 and 1356, wherein the two terminals 1355 and 1356 partially extend over the channel 1354. The terminals 1355 and 1356 may comprise a drain terminal and a source terminal.

Referring to FIG. 3B, in some embodiments, the electrostatic and piezoelectric touch panel 1a comprises a plurality of transparent terminals 1400, wherein the terminal 1341 of the first transistor 134 connects to one transparent terminal 1400, the terminal 1343 of the first transistor 134 and the terminal 1355 of the first piezoelectric-transistor 135 connect to another transparent terminal 1400, and the terminal 1356 of the first piezoelectric-transistor 135 connects to the other transparent terminal 1400.

In some embodiments, the piezoelectric material 1351 comprises polyvinylidend fluoride or polyvinylidene difluoride (PVDF). In one embodiment, the piezoelectric material 1351 only includes PVDF. In one embodiment, the piezoelectric material 1351 comprises a mixture, which comprises PVDF and one of lead zirconate titanate (PZT), zinc oxide (ZnO), barium titanate ($BaTiO_3$), lithium niobate ($LiNbO_3$), and lead titanate ($PbTiO_3$).

Figure 4A:
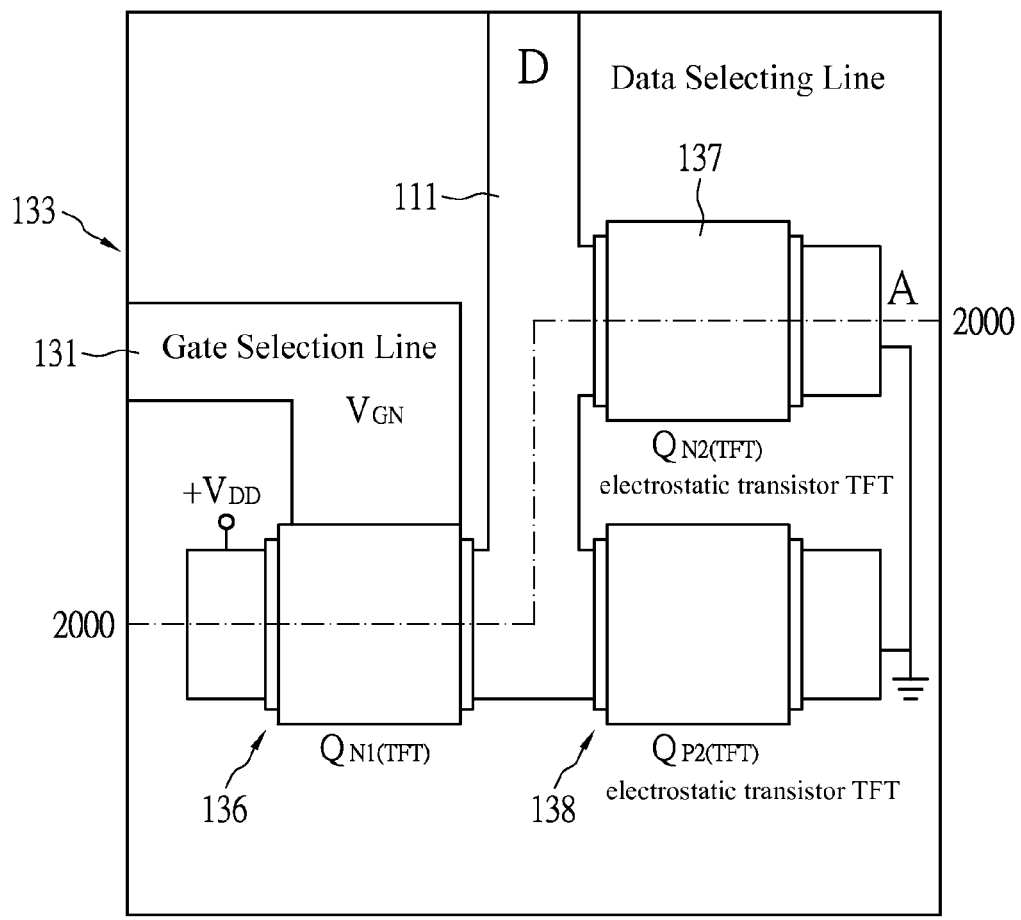
FIG. 4A is a view showing a second sensing device using a positive power source according to one embodiment of the present invention.
Figure 4B:
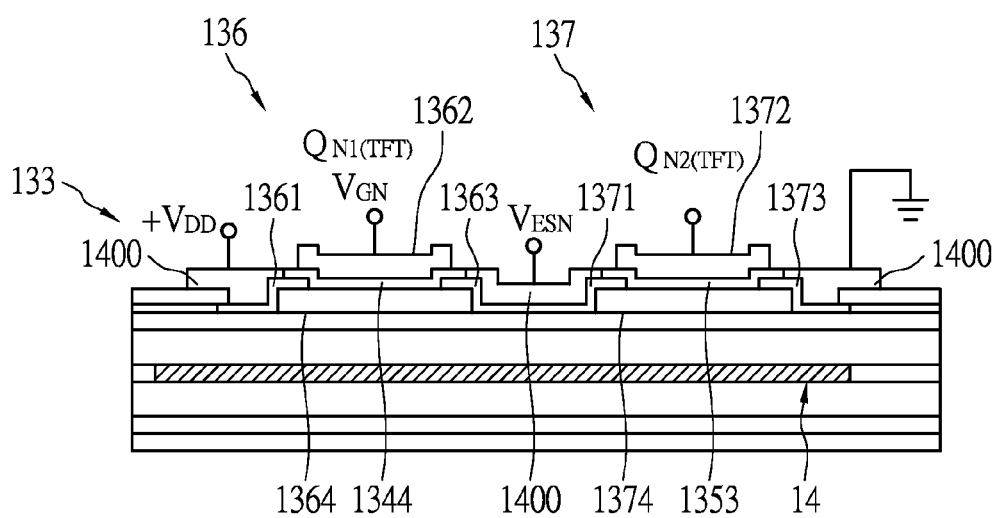
FIG. 4B is a cross-sectional view along line 2000-2000 of FIG. 4A.
Figure 4C:
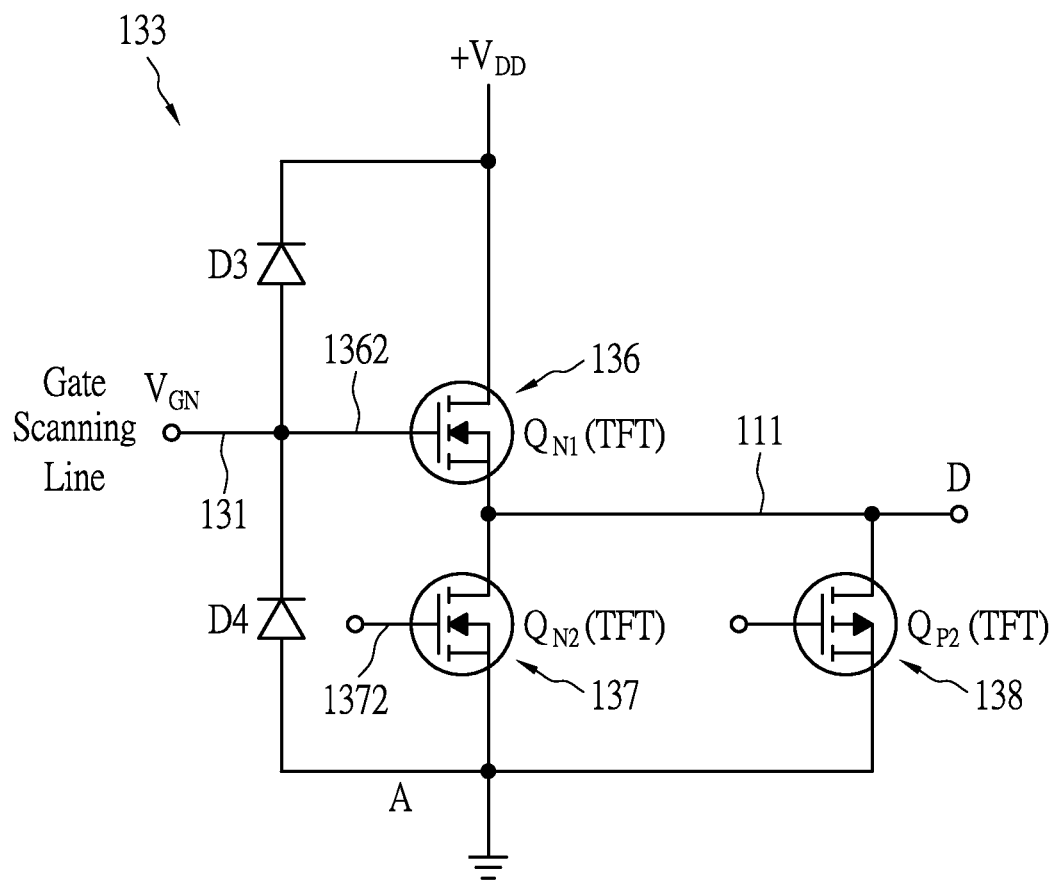
FIG. 4C is a view showing a second sensing device using a positive power source and diodes for prevention of electrostatic discharge damage according to one embodiment of the present invention.

Referring to FIGS. 4A to 4C, the second sensing device 133 comprises a second transistor 136 and two parallel-connected electrostatic transistors 137 and 138. The second transistor 136 and the two parallel-connected electrostatic transistors 137 and 138 are connected in series between a positive power source (+$V_{DD}$) and ground. The first switching circuit 11 connects to a connection linking the corresponding second transistor 136 and the corresponding two parallel-connected electrostatic transistors 137 and 138 through a data selecting line 111. The second switching circuit 12 connects to the gate of the corresponding second transistor 136 through a gate selection line 131. In some embodiments, the second transistor 136 comprises an n-type metal oxide semiconductor field effect transistor. The electrostatic transistor 137 comprises an n-type metal oxide semiconductor field effect transistor. The electrostatic transistor 138 comprises a p-type metal oxide semiconductor field effect transistor. The second transistor 136 and the two parallel-connected electrostatic transistors 137 and 138 are connected in series between a positive power source (+$V_{DD}$) and ground. In some embodiments, the gates of the electrostatic transistors 137 and 138 are floated and not connected with any circuit. In some embodiments, a light-blocking layer 14 is disposed below the two parallel-connected electrostatic transistors 137 and 138, wherein ground terminals of the two parallel-connected electrostatic transistors 137 and 138 connect to the light-blocking layer 14. During the operation of the circuits of the touch panel, the light-blocking layer 14 is grounded so that the light-blocking layer 14 can function as a shielding isolation layer and provide protection against electromagnetic interferences from below circuits of the touch panel.

Referring to FIGS. 4B and 4C, in some embodiments, during a scanning operation, a voltage, $V_{GN}$, applied to the gate selection lines 131 is substantially equal to the voltage of the positive power source (+$V_{DD}$).

Referring to FIG. 4B, the second transistor 136 comprises a semiconductor channel 1364, such as an amorphous silicon or polysilicon channel, and three terminals 1361, 1362, and 1363. The electrostatic transistor 137 comprises a semiconductor channel 1374, such as an amorphous silicon or polysilicon channel, and three terminals 1371, 1372, and 1373.

Referring to FIGS. 3B and 3C, when an object, such as a finger, is far away from a first piezoelectric-transistor 135 of the touch panel 1a, the first piezoelectric-transistor 135 does not conduct and the resistance of the channel 1354 is large. If a voltage is applied to the corresponding gate selection line 131, the first transistor 134 conducts and a current flow therethrough. The current will flow through the first piezoelectric-transistor 135 having a large resistance and consequently, an output voltage with a large absolute value is generated at the terminal B of the data selecting line 110.

Referring to FIGS. 4B and 4C, when an object, such as a finger, is far away from an electrostatic transistor 137, no additional negative charges accumulate at the semiconductor channel 1374 (such as an amorphous silicon or polysilicon channel) of the electrostatic transistor 137, and therefore, the electrostatic transistor 137 is not conduct and grounded (and has a large internal resistance). No additional negative charges accumulate at the semiconductor channel 1374 (such as an amorphous silicon or polysilicon channel) of another transistor 138 either, and therefore, the transistor 138 does not conduct and has a large internal resistance. If a voltage is applied to the gate selection line 131 of the second transistor 136, then the transistor 136 conducts and a current flow therethrough. The current flows through the transistors 137 and 138, which have large internal resistances, and an output voltage with a large absolute value is generated at the terminal D of the data selecting line 111. It can be seen that when an object, such as a finger, is far away from the touch panel, the terminals B (FIG. 3C) and D provide output voltages with large absolute values for the data selecting lines 110 (FIG. 3C) and 111, and sequential application of voltage to gate selection lines 131 can determine that no object, such as a finger, contacts the touch panel.

Referring to FIGS. 3A and 3C, when an object, such as a finger, is close to the touch panel 1a, but does not contact the touch panel 1a, an adjacent first piezoelectric-transistor 135 does not conduct. As shown in FIGS. 4A and 4C, if the object, such as a finger, carries positive charges, negative charges are attracted to the channel of the electrostatic transistor 137 and the channel of the electrostatic transistor 138, and as a result, the electrostatic transistor 137 conducts currents and is grounded; while the electrostatic transistor 138 does not conduct currents. Alternatively, if the object carries negative charges, positive charges are attracted to the channel of the electrostatic transistor 137 and the channel of the electrostatic transistor 138, and as a result, the electrostatic transistor 137 does not conduct charges, while the electrostatic transistor 138 conducts charges and is grounded. If a voltage is applied to the gate selection line 131 of the second transistor 136, the transistor 136 conducts charges and currents are generated. The current flows through one of two parallel-connected electrostatic transistors 137 and 138 that has smaller resistance, and the terminal D generates an output voltage with a small absolute value. If the object does not carry any charge, the electrostatic transistors 137 and 138 do not conduct charges and a voltage with a high absolute value will be generated at the terminal D. Therefore, when an object carries sufficient positive or negative charges, the terminal D provides a voltage with a small absolute value for the corresponding data selecting line, and accordingly, sequential application of voltage to gate selection lines 131 can determine that an object such as a finger contacts the touch panel.

Referring to FIG. 3C, when an object, such a finger, contacts the touch panel, a corresponding first piezoelectric-transistor 135 becomes conductive. When a voltage is applied to the corresponding gate selection line 131, the first transistor 134 becomes conductive and a current is generated. The current will flow through the first piezoelectric-transistor 135, creating an output voltage with a small absolute value at the terminal B. Referring to FIG. 4C, if the object, such as a finger, carries charges, one of the corresponding electrostatic transistors 137 and 138 accumulates charges and becomes conductive. If a voltage is applied to the corresponding gate selection line 131, a current will flow through one of the electrostatic transistors 137 and 138 that has small resistance. As a result, an output voltage with a low absolute value is generated at the terminal D. Therefore, when an object touches the touch panel 1a, the terminals B and D provide voltages with small absolute values for corresponding data selecting lines 110 and 111, and accordingly, sequential application of voltage to gate selection lines 131 can determine whether an object, such as a finger, forms a contact point on the touch panel.

When water is on the touch panel, ice is on the touch panel, the touch panel is under water, or an object with many charges is taking a photo, the touch panel can be switched from a contact-sensing mode to a piezoelectric sensing mode such that the electrostatic transistors 137 and 138 are closed, and only the first piezoelectric-transistors 135 are used to perform detection.

Referring to FIG. 4B, the terminal 1361 of the transistor 136 connects to a transparent terminal 1400. The terminal 1363 of the transistor 136 and the terminal 1371 of the electrostatic transistor 137 connect to the transparent terminal 1400. The terminal 1373 of the electrostatic transistor 137 connects to the transparent terminal 1400.

Figure 5:
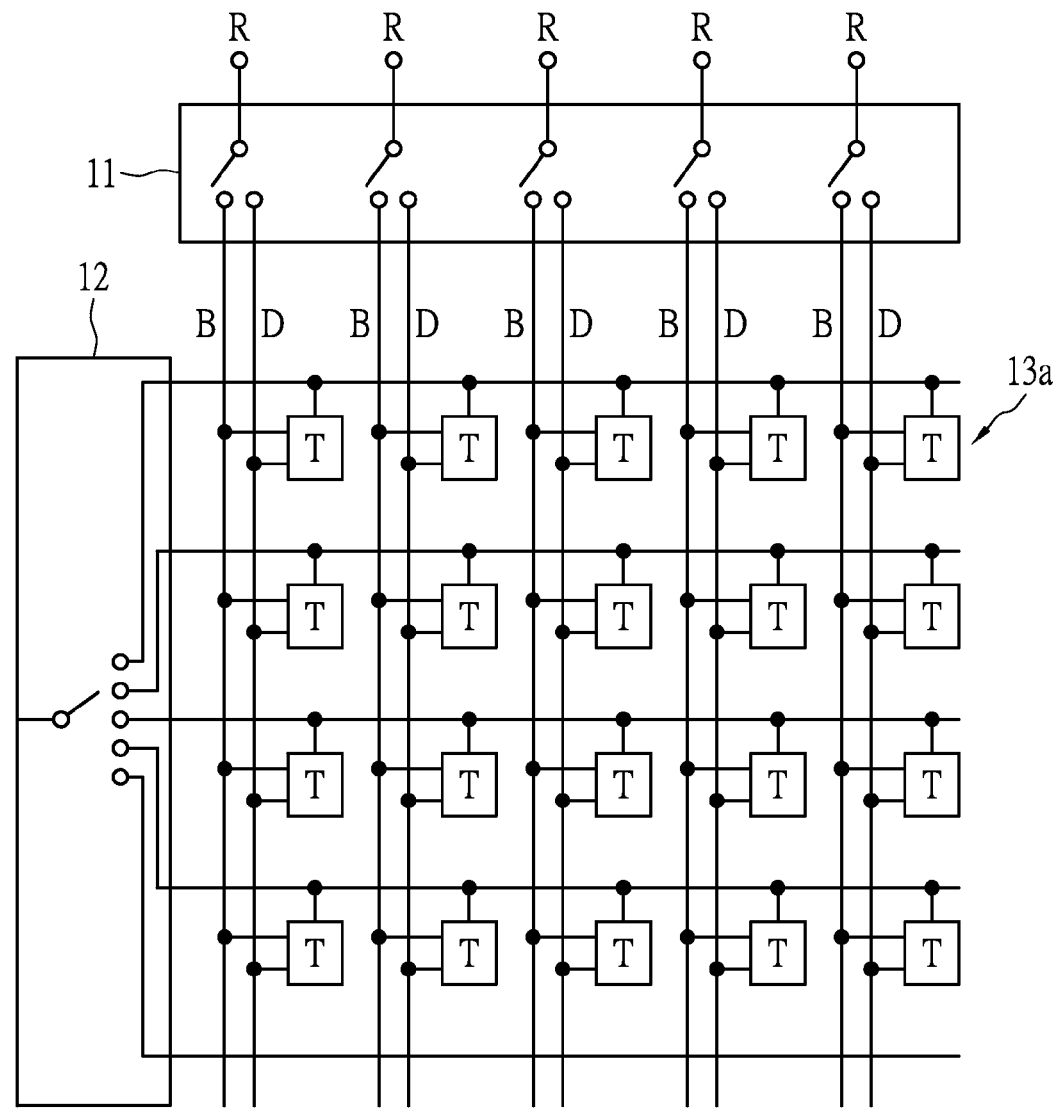
FIG. 5 is a view showing a touch panel using a negative power source according to one embodiment of the present invention.

Referring to FIG. 5, in another embodiment, the embodied circuit is similar to that of the touch panel 1a of FIG. 1. The difference is that the sensing circuit 13 of the touch panel 1a uses a positive power source and the sensing circuit 13a of the touch panel 1b uses a negative power source.

Figure 6:
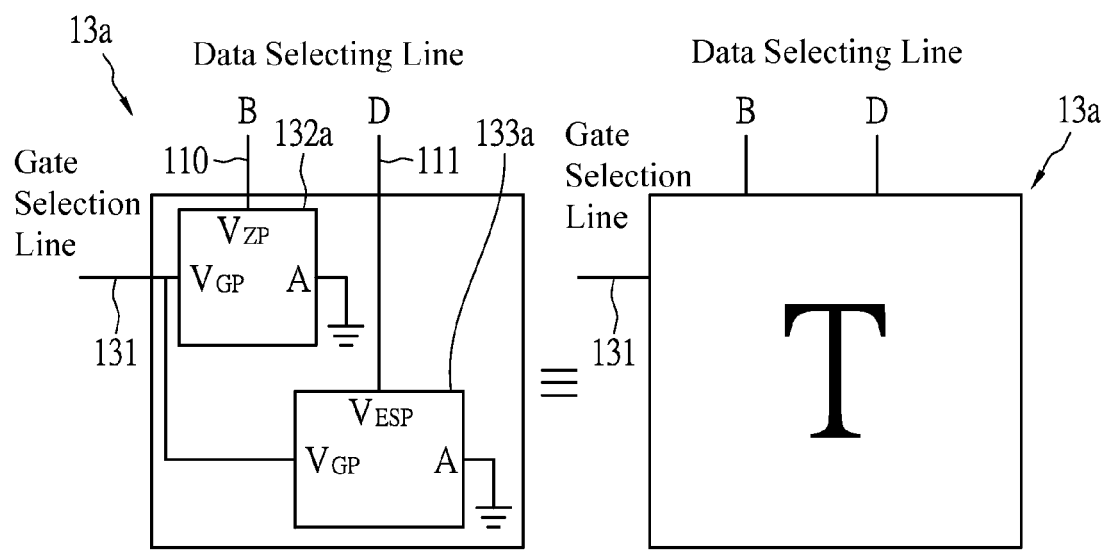
FIG. 6 is a view showing a sensing circuit using a negative power source according to another embodiment of the present invention.

Referring to FIG. 6, each sensing circuit 13a comprises a first sending device 132a and a second sensing device 133a, wherein an output terminal (B) of the first sensing device 132a connects to a data selecting line 110 and an output terminal (D) of the second sensing device 133a connects to a data selecting line 111. Moreover, in some embodiments, the first and second sensing devices 132a and 133a use the same gate selection line 131 to connect to a second switching circuit 12. In addition, the first and second sensing devices 132a and 133a are grounded.

Figure 7A:
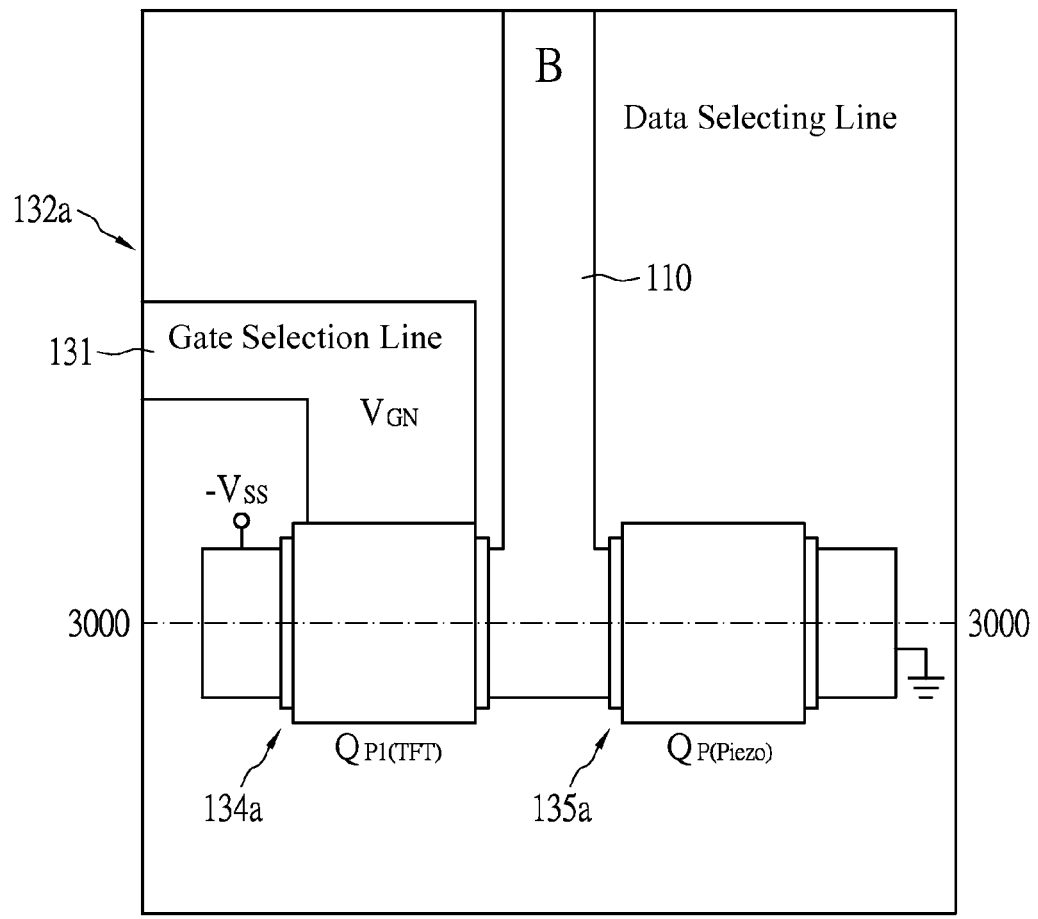
FIG. 7A is a first sensing device using a negative power source according to one embodiment of the present invention.
Figure 7B:
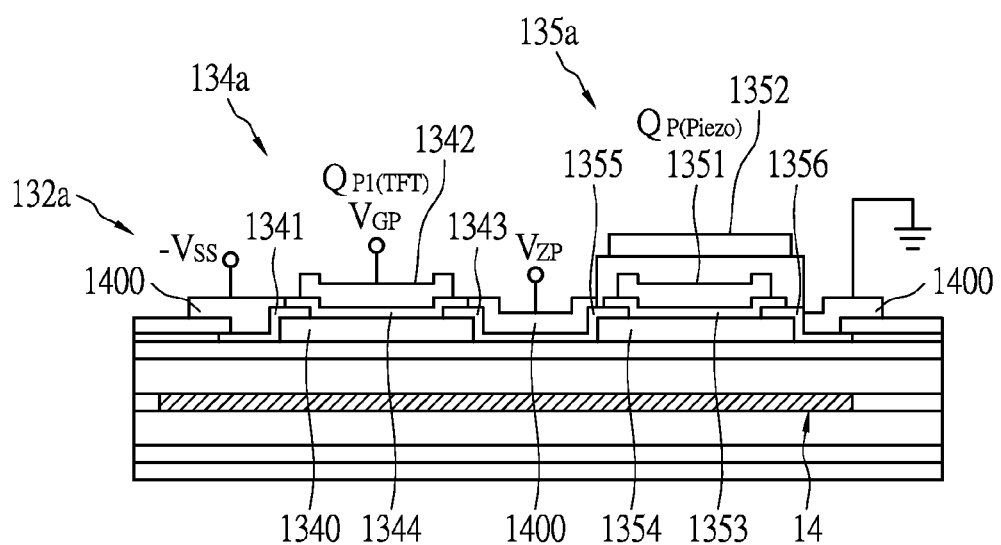
FIG. 7B is a cross-sectional view along line 3000-3000 of FIG. 7A.
Figure 7C:
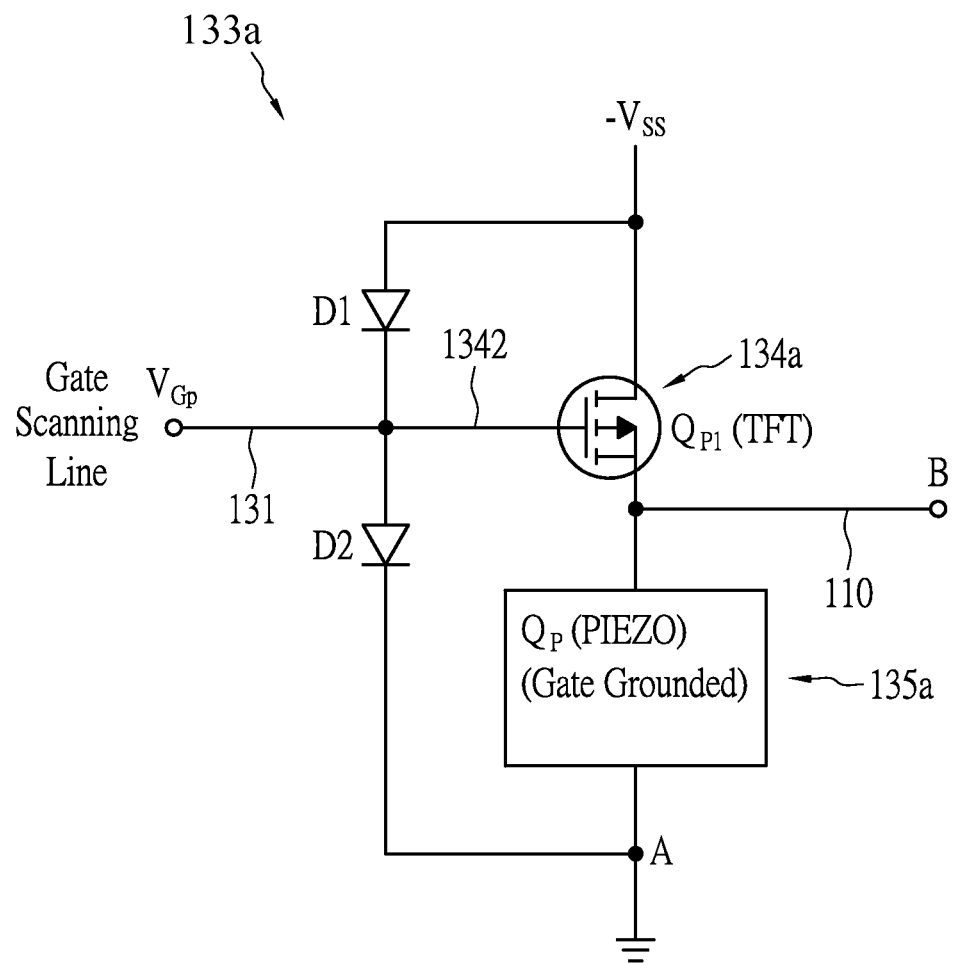
FIG. 7C is a view showing a first sensing device using a negative power source and diodes for prevention of electrostatic discharge damage according to one embodiment of the present invention.

Referring to FIGS. 7A to 7C, the first sensing device 132a comprises a first transistor 134a and a second piezoelectric-transistor 135a. The first transistor 134a comprises a p-type metal oxide semiconductor field effect transistor. The second first piezoelectric-transistor 135a comprises a p-type metal oxide semiconductor field effect transistor. The first transistor 134a and the second piezoelectric-transistor 135a are connected in series between a negative power source ($-V_{SS}$) and ground. The first transistor 134a and the second piezoelectric-transistor 135a can be disposed above a light-blocking layer 14. Before the touch panel 1b is operated, a suitable positive voltage can be applied between the gate 1352 of the second piezoelectric-transistor 135a and the light-blocking layer 14 in order to change the polarization direction of the piezoelectric material 1351 downward. Specifically, negative charges accumulate over the dielectric layer 1353. A small quantity of positive charges in response accumulate on an upper surface of the channel 1354 of the second piezoelectric-transistor 135a, which causes the second piezoelectric-transistor 135a to be in a state of the threshold of current conduction that allows a current of, for example, less than 1 microampere to flow (this invention is not limited to this value). Referring to FIG. 7C, during normal operation of the touch panel 1b, the gate 1352 of the second piezoelectric-transistor 135a is grounded, and thus, when the second piezoelectric-transistor 135a is touched, the strength of upward polarization will increase so that more positive charges accumulate on the upper surface of the channel 1354 of the second piezoelectric-transistor 135a. As a result, even the gate 1352 of the second piezoelectric-transistor 135a is short and grounded, and the channel 1354 allows a larger current of, for example, 10 microamperes (this invention is not limited to this value), to flow.

Referring to FIGS. 7B and 7C, in some embodiments, during a scanning operation, a voltage, $V_{GP}$, applied to the gate selection lines 131 is substantially equal to the voltage of the positive power source ($-V_{SS}$).

Figure 8A:
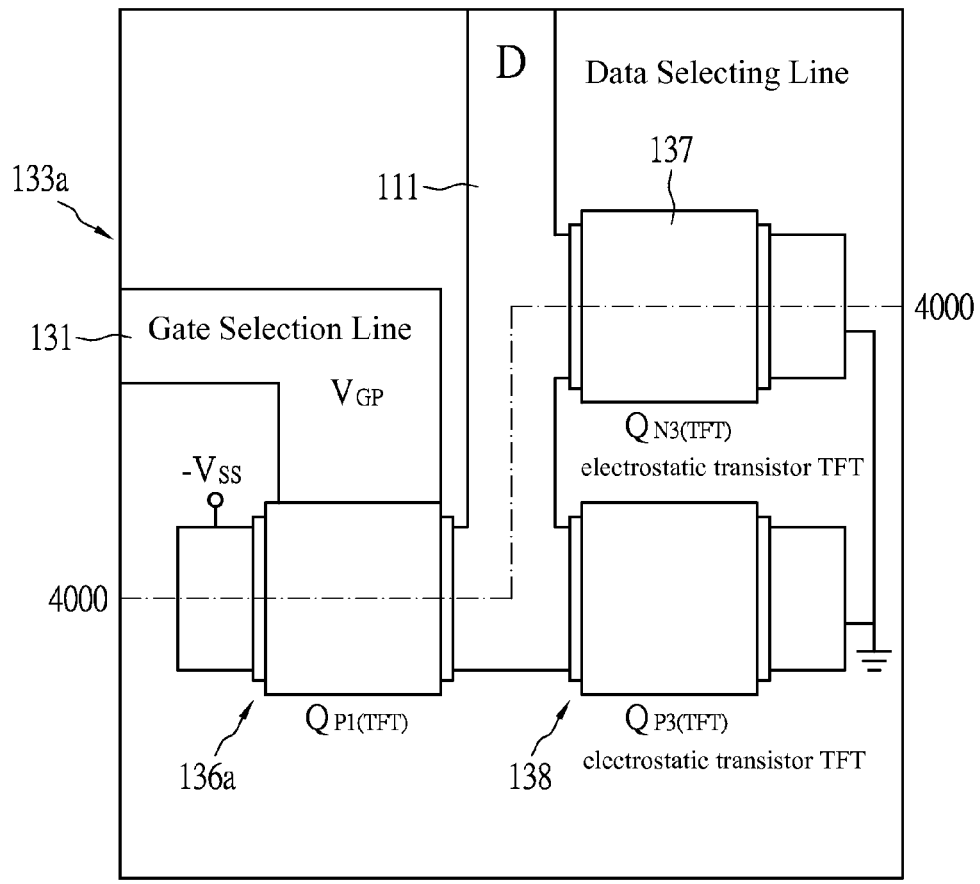
FIG. 8A is a view showing a second sensing device using a negative power source according to one embodiment of the present invention.
Figure 8B:
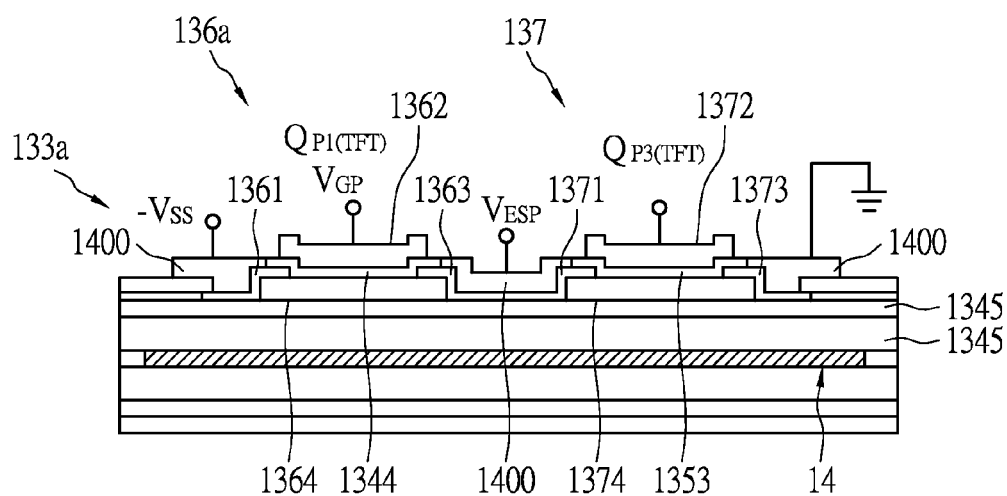
FIG. 8B is a cross-sectional view along line 4000-4000 of FIG. 8A.
Figure 8C:
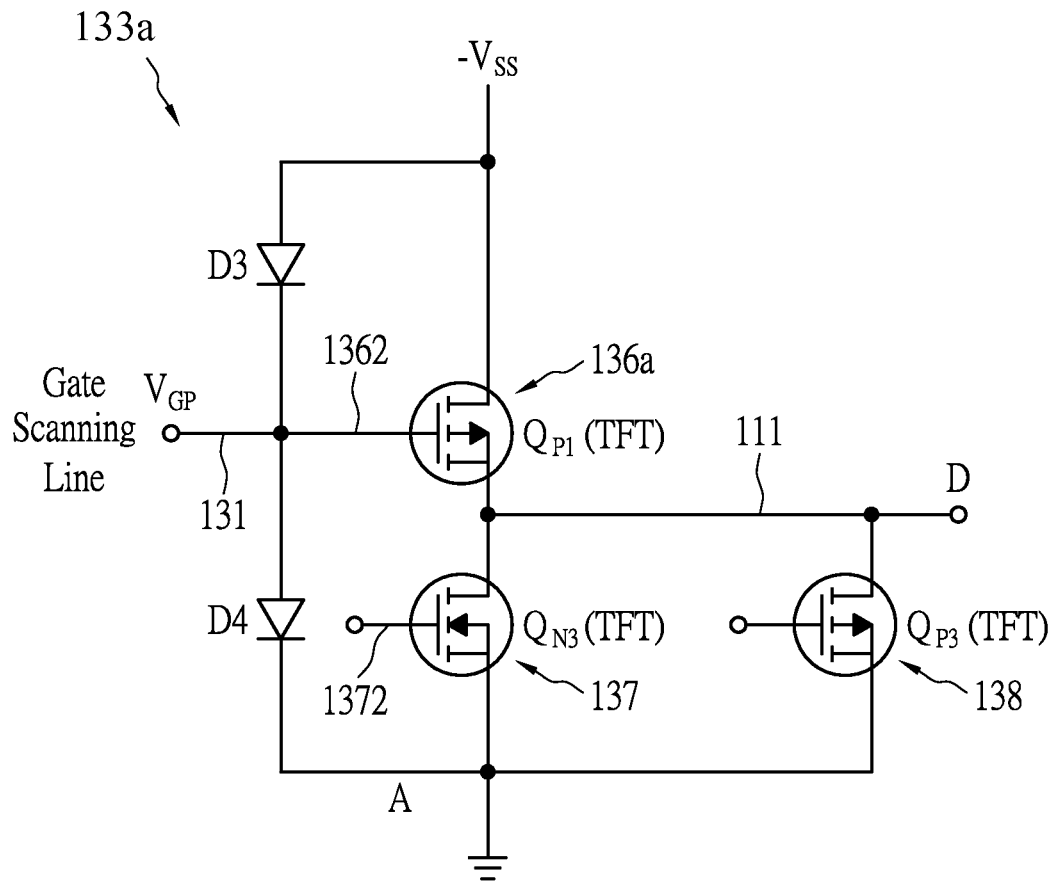
FIG. 8C is a view showing a second sensing device using a negative power source and diodes for prevention of electrostatic discharge damage according to one embodiment of the present invention.

Referring to FIGS. 8A to 8C, the second sensing device 133a (FIG. 6) comprises a p-type second transistor 136a and two parallel-connected electrostatic transistors 137 and 138. The second transistor 136a and the two parallel-connected electrostatic transistors 137 and 138 are connected in series between a negative power source ($-V_{SS}$) and ground. The first switching circuit 11 uses a data selecting line 111 to connect to a connection linking the second transistor 136a and the two parallel-connected electrostatic transistors 137 and 138. The second switching circuit 12 uses a gate selection line 131 to connect to the gate of a second transistor 136a. The electrostatic transistor 137 comprises an n-type metal oxide semiconductor field effect transistor. The electrostatic transistor 138 comprises a p-type metal oxide semiconductor field effect transistor.

Figure 9:
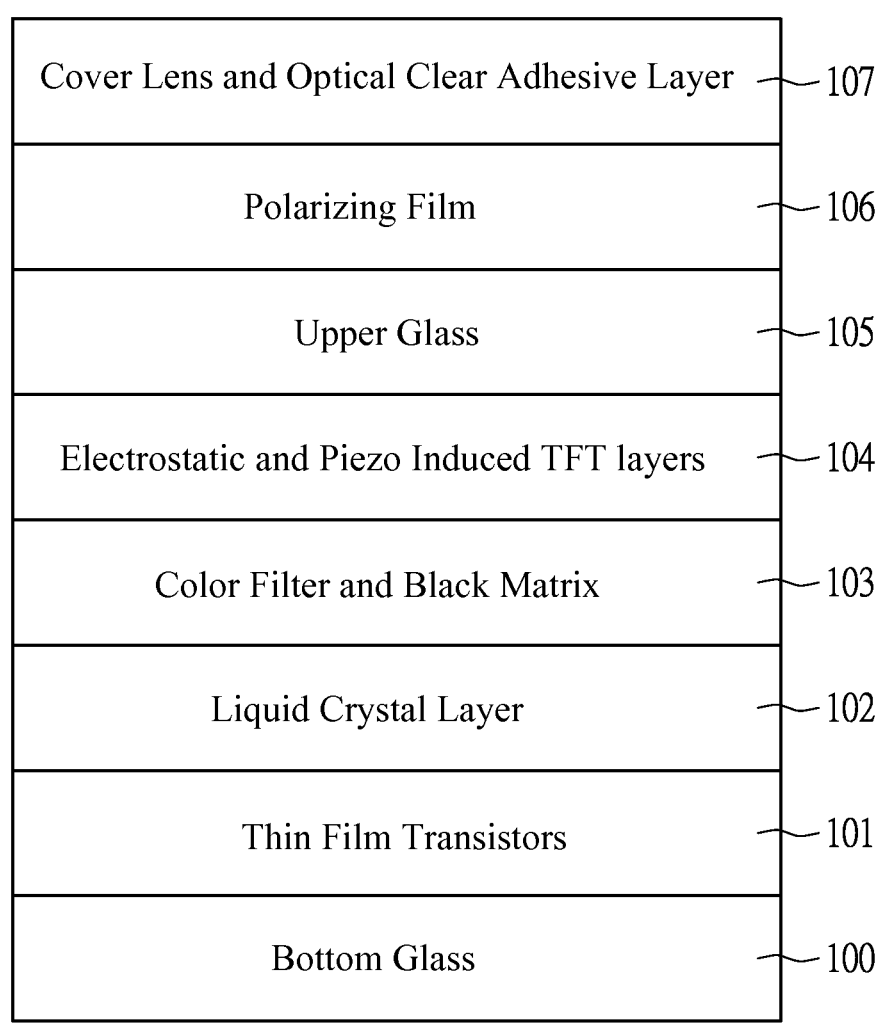
FIG. 9 is a view showing the structure of a touch panel according to one embodiment of the present invention.

Referring to FIG. 9, the touch panel 1a or 1b comprises a lower glass 100, a plurality of thin-film transistors 101, a liquid crystal layer 102 controlled by the thin-film transistors 101, a color filter and arrayed light-blocking layer combination 103, a plurality of sensing circuits 104 disposed over the color filter and arrayed light-blocking layer combination 103, an upper glass 105 disposed over the sensing circuits 104, a polarization film 106 disposed on the upper glass 105, and an optical bonding layer 107 disposed on the polarization film 106.

Referring to FIGS. 3C and 7C, the sensing device 132 (FIGS. 2 and 3A) may comprise at least one diode D1 and at least one diode D2 both configured for prevention of electrostatic discharge damage. The diode D1 connects to the gate 1342 of the first transistor 134 and to the terminal of the first transistor 134 that connects to the negative power source ($-V_{SS}$). The diode D2 connects to the gate 1342 of the first transistor 134 and to the gate terminal of the first transistor that connects to ground. The diodes D1 and D2 can discharge the charges accumulated on the gate 1342 of the first transistor 134 so as to limit the voltages $V_{GN}$ and $V_{GP}$ between $V_{DD}$ and $-V_{SS}$. As a result, the voltages will not exceed the gate breakdown voltage and the transistor 134 will be protected from being damaged.

Referring to FIGS. 4C and 8C, the second sensing device 133 (or 133a) (FIGS. 6 and 8A) comprises at least one diode D3 and at least one diode D4 both configured for prevention of electrostatic discharge damage. The diode D3 connects to the gate 1362 of the second transistor 136 (or 136a) and to the gate terminal of the second transistor 136 (or 136a) that connects to a positive or negative power source ($+V_{DD}$ or $-V_{SS}$). The diode D4 connects to the gate 1362 of the second transistor 136 (or 136a) and to the gate terminal of the second transistor 136 (or 136a) that connects to ground. The diodes D3 and D4 can discharge the charges accumulated on the gate 1362 of the second transistor 136 so as to limit the gate voltages $V_{GN}$ and $V_{GP}$ of the second transistor 136 (or 136a) to between $V_{DD}$ and $-V_{SS}$. As a result, the voltages will not exceed the gate breakdown voltage of the second transistor 136 (or 136a) and the transistor 136 will be protected from being damaged.

Referring to FIGS. 4C and 8C, in some embodiments, at least one diode can be connected between the gates of the electrostatic-transistors 137 and 138 and ground (not drawn), thereby limiting the voltage on the gates below the breakdown voltage of the transistor (137 or 138) so as to protect the transistor from being damaged.

Figure 10:
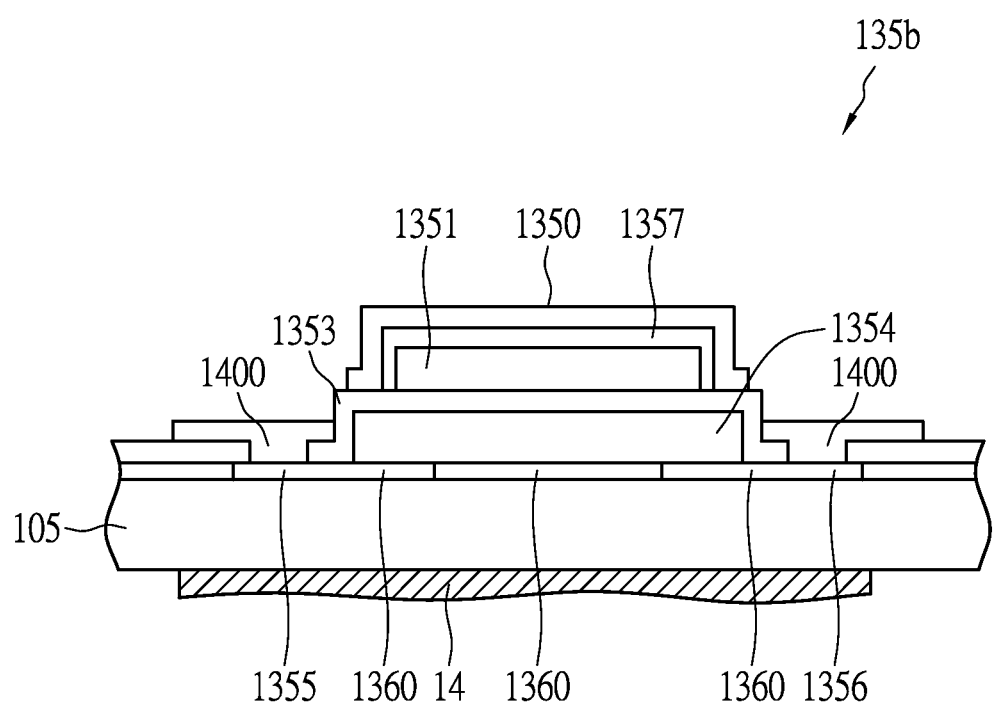
FIG. 10 is a view showing a third piezoelectric transistor according to one embodiment of the present invention.

Referring to FIG. 10, another embodiment of the present invention discloses a third piezoelectric-transistor 135b. The third piezoelectric-transistor 135b can replace the first and second piezoelectric-transistor 135 and 135a. The method for manufacturing the third piezoelectric-transistor 135b comprises forming light-blocking layers 14 on a upper glass 105; vapor-depositing an amorphous silicon or polysilicon material; doping p-type or n-type impurities at two ends of each amorphous silicon or polysilicon material in order to form a source 1355 and a drain 1356 of the third piezoelectric-transistor 135b; vapor-depositing another amorphous silicon or polysilicon material in order to form a channel 1354 of the third piezoelectric-transistor 135b, wherein the source 1355 and drain 1356 of the third piezoelectric-transistor 135b partially extend below the channel 1354 of the third piezoelectric-transistor 135b; forming a piezoelectric material 1351 on the channel 1354 of the third piezoelectric-transistor 135b, wherein a dielectric layer 1353 is used for separating the piezoelectric material 1351 and the channel 1354; and forming transparent terminals 1400 to connect with the three terminals 1350, 1355, and 1356 of the third piezoelectric-transistor 135b, wherein the gate terminal 1350 of the third piezoelectric-transistor 135b is formed above the corresponding piezoelectric material 1351 and a dielectric material 1357 separates the gate terminal 1350 and the piezoelectric material 1351. In some embodiments, the gate 1350 of the third piezoelectric-transistor 135b is a transparent terminal.

In at least one embodiment, a touch panel includes electrostatic sensing circuits and piezoelectric sensing circuits. The electrostatic sensing circuits and the piezoelectric sensing circuits can detect the position of an object (e.g. a finger) that contact or does not contact the touch panel. In at least one embodiment, the electrostatic sensing circuits can be shut down, only leaving the piezoelectric sensing circuits active. In some embodiments, the piezoelectric sensing circuits can be shut down, only leaving the electrostatic sensing circuits active. In at least one embodiment, the results from the piezoelectric sensing circuits can be integrated with or used to verify those from the electrostatic sensing circuits so that a false judgment can be avoided and reliability can be improved.

It will be apparent to those skilled in the art that various modifications and variations can be made to the disclosed embodiments. It is intended that the specification and examples be considered as exemplary only, with a true scope of the disclosure being indicated by the following claims and their equivalent.

What is claimed is:

1. An electrostatic and piezoelectric touch panel comprising:
    a first switching circuit;
    a second switching circuit;
    at least one first sensing device comprising a first transistor and a piezoelectric-transistor connected with the first transistor in series between a power source and ground, wherein the first switching circuit connects to a connection linking the first transistor and the piezoelectric-transistor; and
    at least one second sensing device comprising a second transistor and to two parallel-connected electrostatic transistors connected with the second transistor in series between the power source and the ground,
    wherein the first switching circuit connects to a connection linking the second transistor and the two parallel-connected electrostatic transistors;
    wherein each gate of the first and second transistors connects to the second switching circuit; wherein the two parallel-connected electrostatic transistors comprise different types of doped semiconductor materials.

2. The electrostatic and piezoelectric touch panel of claim 1, wherein the first transistor is an n-type metal oxide semiconductor field effect transistor.

3. The electrostatic and piezoelectric touch panel of claim 2, wherein the power source is a positive power source.

4. The electrostatic and piezoelectric touch panel of claim 1, wherein the first transistor is a p-type metal oxide semiconductor field effect transistor.

5. The electrostatic and piezoelectric touch panel of claim 4, wherein the power source is a negative power source.

6. The electrostatic and piezoelectric touch panel of claim 1, wherein the piezoelectric-transistor is an n-type piezoelectric metal oxide semiconductor field effect transistor.

7. The electrostatic and piezoelectric touch panel of claim 1, wherein the piezoelectric-transistor is a p-type piezoelectric metal oxide semiconductor field effect transistor.

8. The electrostatic and piezoelectric touch panel of claim 1, wherein the second transistor is an n-type metal oxide semiconductor field effect transistor.

9. The electrostatic and piezoelectric touch panel of claim 1, wherein the second transistor is a p-type metal oxide semiconductor field effect transistor.

10. The electrostatic and piezoelectric touch panel of claim 1, wherein the two parallel-connected electrostatic transistors comprise an n-type metal oxide semiconductor field effect transistor and a p-type metal oxide semiconductor field effect transistor.

11. The electrostatic and piezoelectric touch panel of claim 1, wherein the first and second sensing devices are respectively formed above a light-blocking layer.

12. The electrostatic and piezoelectric touch panel of claim 1, wherein a gate of the two parallel-connected electrostatic transistors is floated.

13. The electrostatic and piezoelectric touch panel of claim 1, wherein a gate of the piezoelectric-transistor is grounded.

14. The electrostatic and piezoelectric touch panel of claim 1, wherein a portion of a drain terminal and a portion of a source terminal of the piezoelectric-transistor extend over or under a channel of the piezoelectric-transistor.

* * * * *